United States Patent [19]

Okada et al.

[11] Patent Number: 4,989,052
[45] Date of Patent: Jan. 29, 1991

[54] QUANTUM EFFECT SEMICONDUCTOR DEVICE

[75] Inventors: Makoto Okada, Yokohama; Naoki Yokoyama, Atsugi, both of Japan

[73] Assignee: Fujitsu Limited, Kawasaki, Japan

[21] Appl. No.: 207,991

[22] Filed: Jun. 17, 1988

[30] Foreign Application Priority Data

Jun. 19, 1987 [JP] Japan .................. 62-151298

[51] Int. Cl.⁵ ............................. H01L 29/80
[52] U.S. Cl. ......................... 357/22; 357/15; 357/16
[58] Field of Search ............. 357/22 A, 22 MD, 22 I, 357/22 S, 22 G, 22 GR, 15, 16

[56] References Cited

U.S. PATENT DOCUMENTS 4,663,643  5/1987  Mimura ..................... 357/22 A
4,833,508  5/1989  Ishikawa et al. ........... 357/22 A

FOREIGN PATENT DOCUMENTS 248261A  4/1987  Japan .
63-52484  3/1988  Japan ..................... 357/22 A

OTHER PUBLICATIONS

H. Sakaki, "Scattering Suppression and High-Mobility Effect of Size-Quantized Electrons in Ultrafine Semiconductor Wire Structures", Japanese Journal of Applied Physics, vol. 19, No. 12, Dec. 1980, pp. L735-738.

W. J. Skocpol et al., "One-Dimensional Localization and Interaction Effects in Narrow (0.1 μm) Silicon Inversion Layers", Physical Review Letters, vol. 49, No. 13, 27 Sep. 1982.

P. M. Petroff et al., "Toward Quantum Well Wires: Fabrication and Optical Properties", Applied Physics Letters, 41(7), 1 Oct. 1982.

H. Okamoto, "Semiconductor Quantum-Well Structures for Optoelectronics; Recent Advances and Future Prospects", Japanese Journal of Applied Physics, vol. 26, No. 3, Mar. 1987, pp. 315-330.

Primary Examiner—Andrew J. James
Assistant Examiner—Sara W. Crane
Attorney, Agent, or Firm—Armstrong, Nikaido, Marmelstein, Kubovcik & Murray

[57] ABSTRACT

A quantum effect semiconductor device a channel layer which is substantially a non-doped semiconductor and an n-type (or p-type) carrier supplying layer which is formed on a substrate and having a smaller electron affinity than the channel layer, and an n-type (or p-type) cap layer selectively formed on the carrier supplying layer so that an electron gas layer is formed only at a portion of the channel layer which is immediately under the cap layer.

18 Claims, 12 Drawing Sheets

QUANTUM EFFECT SEMICONDUCTOR DEVICE

BACKGROUND OF THE INVENTION

The present invention generally relates to quantum effect semiconductor devices, and more particularly to a quantum effect semiconductor device having a one-dimensional ultra-fine wire structure for confining carriers.

Recently, there is active research in the field of one-dimensional ultra-fine wire structure (hereinafter referred to as a quantum well wire) for confining carriers. When the quantum well wire is used as a channel of a quantum effect semiconductor device, the impurity scattering decreases at low temperatures. Accordingly, the mobility of the carriers increases, thereby increasing the switching speed of the quantum effect semiconductor device. This technology is also important when forming a quantum well box.

FIG. 1 is a perspective view of an essential part of a quantum effect semiconductor device proposed in "Scattering Suppression and High-Mobility Effect of Size-Quantized Electrons in Ultrafine Semiconductor Wire Structures" by H. Sakaki, Japanese Journal of Applied Physics, Vol.19, No.12, December 1980, pp.L735–738. In FIG. 1, the semiconductor device comprises a barrier layer 1, a channel layer 2, a barrier layer 3, an insulator layer 4, a gate electrode 5, and a channel region 6.

FIG. 2 is a perspective view of an essential part of a quantum effect semiconductor device proposed in "One-Dimensional Localization and Interaction Effects in Narrow (0.1 $\mu$m) Silicon Inversion Layers" by W. J. Skocpol et al, Physical Review Letters, Vol.49, No.13, 27 Sept. 1982. In FIG. 2, the semiconductor device comprises a p-type silicon (Si) substrate 11, a channel layer 12, an insulator layer 13, and a gate electrode 14.

FIG. 3 is a perspective view of an essential part of a quantum effect semiconductor device proposed in "Toward Quantum Well Wires: Fabrication and Optical Properties" by P. M. Petroff et al, Applied Physics Letters, 41(7), 1 Oct. 1982. The semiconductor device comprises a barrier layer 21, a channel layer 22, a barrier layer 23, and a barrier layer 24.

In each of the proposed semiconductor devices shown in FIGS. 1 through 3, the channel layer constitutes a quantum well wire.

On the other hand, "Semiconductor Quantum-Well Structures for Optoelectronics; Recent Advances and Future Prospects" by H. Okamoto, Japanese Journal of Applied Physics, Vol.26, No.3, March 1987, pp.315–330 discloses a method of forming the quantum well wire by focused ion beam (FIB) injection of gallium (Ga) ions.

However, according to these proposed methods, it is thought extremely difficult to actually realize a quantum effect semiconductor device having the quantum well wire for the following reasons.

Firstly, according to the proposed semiconductor device shown in FIG. 1, a V-groove having a V-shape is formed in the barrier layer 1, the channel layer 2 and the barrier layer 3, and the insulator layer 4 and the gate electrode 5 are then formed in the V-groove. It is impossible to obtain a satisfactory characteristic for the semiconductor device because the channel layer 6 is formed at a processed surface which is processed at the time of forming the V-groove, and furthermore, since the insulator layer 4 is formed on the channel layer 6 after the formation of the V-groove. In other words, an interface between the channel layer 6 and the insulator layer 4 is subjected to two processes, that is, the process of forming the V-groove and the process of forming the insulator layer 4. This means that the channel layer 6 is extremely close to the processed surface of the V-groove and is also easily damaged during the process of forming the insulator layer 4.

Secondly, according to the proposed semiconductor device shown in FIG. 2, the width of the quantum well wire is only 0.1 $\mu$m and is not sufficiently small to obtain a satisfactory one-dimensional quantum effect.

Thirdly, according to the proposed semiconductor device shown in FIG. 3, the channel layer 22 is formed at a processed surface as in the case of the device shown in FIG. 1, and it is impossible to obtain a satisfactory characteristic for the semiconductor device.

Fourthly, according to the method of forming the quantum well wire by the FIB of Ga ions, the width of the quantum well wire which can be formed is in the order of 0.1 $\mu$m and is not sufficiently small to obtain a satisfactory one-dimensional quantum effect.

The problems of the conventional semiconductor device having the quantum well wire can be summarized as follows. That is, it is extremely difficult to obtain such a quantum well wire that displays a notable quantum effect or confines the carriers one-dimensionally, because the channel is formed at a processed surface and the processing technique is not yet established for forming a quantum well wire.

SUMMARY OF THE INVENTION

Accordingly, it is a general object of the present invention to provide a novel and useful quantum effect semiconductor device in which the problems described heretofore are eliminated.

Another and more specific object of the present invention is to provide a quantum effect semiconductor device having a quantum well wire or quantum well box which satisfactorily confines carriers and can easily be formed by use of well established processing techniques.

Still another object of the present invention is to provide a quantum effect semiconductor device comprising a substantially non-doped channel layer and an n-type (or p-type) carrier supplying layer which are formed on a substrate, and an n-type (or p-type) cap layer selectively formed on the carrier supplying layer so that an electron gas layer is formed only at a portion of the non-doped channel layer immediately under the cap layer. According to the semiconductor device of the present invention, it is possible to make the width of the electron gas layer small compared to that of the cap layer, thereby making it possible to form a quantum well wire structure.

A further object of the present invention is to provide a quantum effect semiconductor device comprising a substantially non-doped channel layer and an n-type (or p-type) carrier supplying layer which are formed on a substrate, a plurality of n-type (or p-type) cap layers selectively formed on the carrier supplying layer so that an electron gas layer is formed only at portions of the non-doped channel layer immediately under the cap layers, and a source region and a drain region formed on both ends of the cap layers along a longitudinal direction thereof.

Another object of the present invention is to provide a quantum effect semiconductor device comprising a substrate, a channel layer formed on the substrate and being substantially non-doped semiconductor, a doped carrier supplying layer formed on the channel layer and having a smaller electron affinity than the channel layer, a doped cap layer formed on the doped carrier supplying layer in a form of an ultra-fine wire, a gate electrode formed on the doped cap layer, a source electrode and a drain electrode formed at both sides of the gate electrode, a depletion region formed in the doped carrier supplying layer and extending to an interface between the channel layer and the doped carrier supplying layer except for a portion immediately under the doped cap layer, and bias means for applying a voltage across the gate electrode and the source electrode. The voltage controls a spreading of the depletion region thereby controlling a width of a one-dimensional electron gas layer at a heterointerface on a side of the channel layer immediately under the doped cap layer.

Still another object of the present invention is to provide a quantum effect semiconductor device comprising a substrate, a channel layer formed on the substrate and being substantially non-doped semiconductor, a doped carrier supplying layer formed on the channel layer and having a smaller electron affinity than the channel layer, a doped cap layer formed on the doped carrier supplying layer in a form of an ultra-fine wire, a gate electrode formed on the substrate, a source electrode and a drain electrode each formed on the doped carrier supplying layer, a depletion region formed in the doped carrier supplying layer and extending to an interface between the channel layer and the doped carrier supplying layer except for a portion immediately under the doped cap layer, and bias means for applying a voltage across the gate electrode and the source electrode The voltage controls a spreading of the depletion region thereby controlling a width of a one-dimensional electron gas layer at a heterointerface on a side of the channel layer immediately under the doped cap layer.

A further object of the present invention is to provide a quantum effect semiconductor device comprising a substrate, a doped bias voltage applying layer formed on the substrate, a channel layer formed on the doped bias voltage applying layer and being substantially non-doped semiconductor, a doped carrier supplying layer formed on the channel layer and having a smaller electron affinity than the channel layer, a doped cap layer formed on the doped carrier supplying layer in a form of an ultra-fine wire, a gate electrode formed on the bias voltage applying layer, a source electrode and a drain electrode each formed on the doped carrier supplying layer, a depletion region formed in the doped carrier supplying layer and extending to an interface between the channel layer and the doped carrier supplying layer except for a portion immediately under the doped cap layer, and bias means for applying a voltage across the gate electrode and the source electrode. The voltage controls a spreading of the depletion region thereby controlling a width of a one-dimensional electron gas layer at a heterointerface on a side of the channel layer immediately under the doped cap layer.

Another object of the present invention is to provide a quantum effect semiconductor device comprising a substrate, a channel layer formed on the substrate and being substantially non-doped semiconductor, a multiquantum well formed on the channel layer, a doped carrier supplying layer formed on the multiquantum well and having a smaller electron affinity than the channel layer, a doped cap layer formed on the doped carrier supplying layer in a form of an ultra-fine wire, a gate electrode, a source electrode and a drain electrode each formed on the doped carrier supplying layer, a depletion region formed in the doped carrier supplying layer and extending to an interface between the channel layer and the doped carrier supplying layer except for a portion immediately under the doped cap layer, and bias means for applying a voltage across the gate electrode and the channel layer. The voltage controls a spreading of the depletion region thereby controlling a width of a one-dimensional electron gas layer at a heterointerface on a side of the channel layer immediately under the doped cap layer.

Other objects and further features of the present invention will be apparent from the following detailed description when read in conjunction with the accompanying drawings.

DETAILED DESCRIPTION

Generally, a semiconductor device which forms a two-dimensional carrier gas layer by the so-called modulation doping heterojunction for use as a channel is known as a high electron mobility transistor (HEMT). The present invention forms a satisfactory quantum well wire by using the fact that the formation of the two-dimensional carrier gas layer is dependent on the existence of a cap layer on a carrier supplying layer.

Figure 4:
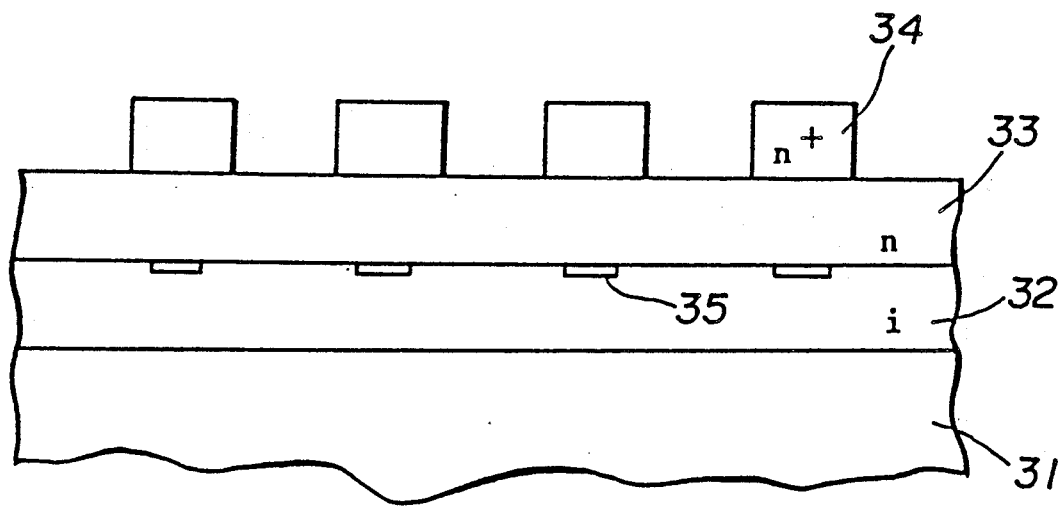
FIG. 4 is a side view in cross section showing an essential part of a first embodiment of the quantum effect semiconductor device according to the present invention.

FIG. 4 shows an essential part of a first embodiment of the quantum effect semiconductor device according to the present invention. In FIG. 4, the semiconductor device comprises a semiinsulative gallium arsenide (GaAs) substrate 31, an intrinsic GaAs channel layer 32, an n-type aluminum gallium arsenide (AlGaAs) electron supplying layer 33, an n+-type GaAs cap layer 34, and a one-dimensional electron gas layer 35.

As may be seen from FIG. 4, portions of the cap layer 34 are removed intermittently. Accordingly, a depletion layer extends exceeding the heterointerface under the removed portion, thereby eliminating the electron gas layer under the removed portion. As a result, the one-dimensional electron gas layer 35 is formed only immediately under the cap layer 34. In addition, the width of the one-dimensional electron gas layer 35 is narrow and is approximately one-half that of the cap layer 34.

Figure 5:
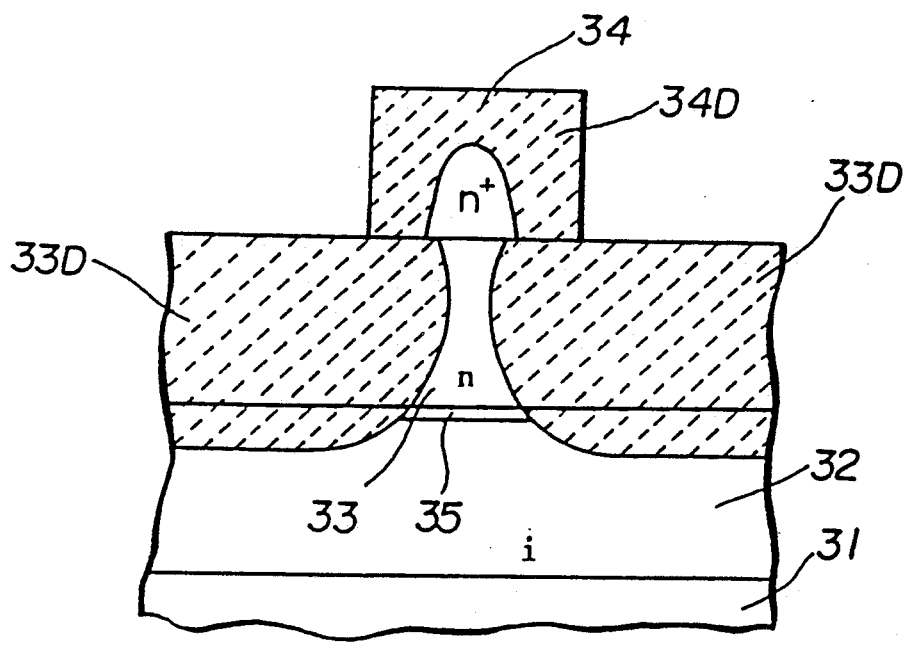
FIG. 5 is a side view in cross section showing an essential part of the first embodiment on an enlarged scale.

FIG. 5 shows an essential part of the embodiment shown in FIG. 4 on an enlarged scale, for explaining the reason why the width of the one-dimensional electron gas layer 35 becomes narrow compared to that of the cap layer 34. In FIG. 5, those parts which are the same as those corresponding parts in FIG. 4 are designated by the same reference numerals, and a description thereof will be omitted.

As may be seen from FIG. 5, a depletion region 34D spreads from side walls and top surface of the cap layer 34. In addition, depletion regions 33D spread two-dimensionally in the electron supplying layer 33. As a result, the width of the one-dimensional electron gas layer 35 is narrow compared to that of the cap layer 34 immediately above the one-dimensional electron gas layer 35.

No special processing technique is required to produce the first embodiment of the quantum effect semiconductor device. The cap layer 34 needs to be patterned into the quantum well wire (ultra-fine wire structure), but this may be achieved by the technique used to form corrugation of a distributed feedback type semiconductor laser, that is, the exposure technique using two-beam laser interference or the like.

Therefore, the quantum effect semiconductor device according to the present invention comprises a substrate such as the semiinsulative GaAs substrate 31, a non-doped channel layer such as the intrinsic GaAs channel layer 32 and a doped carrier supplying layer such as the n-type AlGaAs electron supplying layer 33 which are formed on the substrate, and a doped cap layer such as the n+-type GaAs cap layer 34 selectively formed on the doped carrier supplying layer so as to form an electron gas layer such as the one-dimensional electron gas layer 35 only at the non-doped channel layer immediately under the doped cap layer.

Hence, the electron gas layer is only formed at the non-doped channel layer immediately under the doped cap layer which is selectively formed on the doped carrier supplying layer. Moreover, due to the effect of the depletion layer, the width or area of the electron gas layer is small compared to that of the doped cap layer. The electron gas layer can be used as the quantum well wire or quantum well box, thereby making it easy to produce a quantum effect semiconductor device having a satisfactory characteristic.

Figure 1:
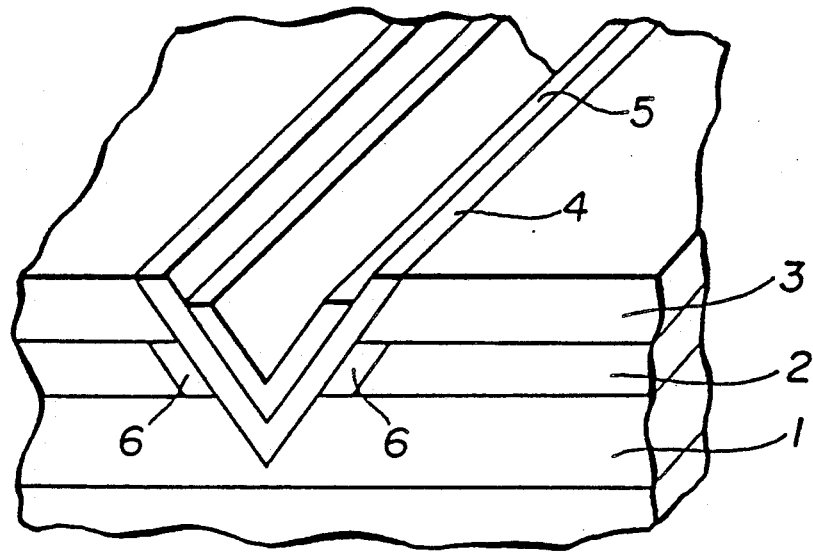
FIG. 1 is a perspective view showing a conventional quantum effect semiconductor device having a quantum well wire.
Figure 2:
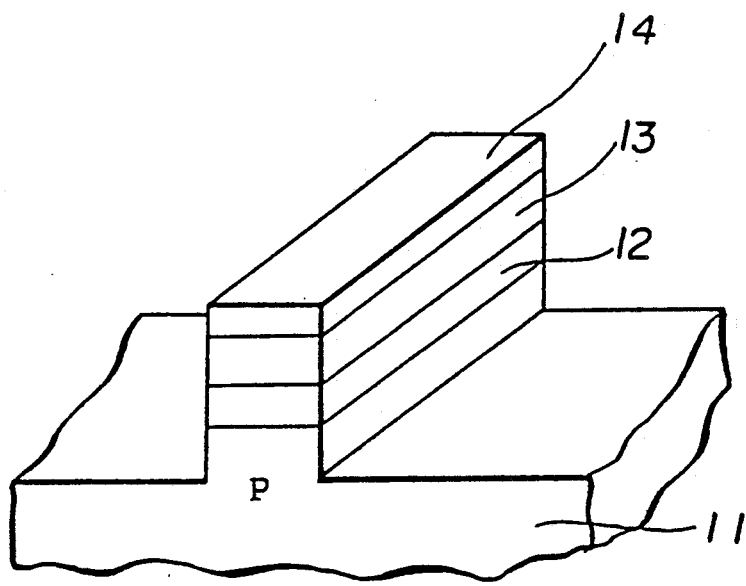
FIG. 2 is a perspective view showing another conventional quantum effect semiconductor device having a quantum well wire.
Figure 3:
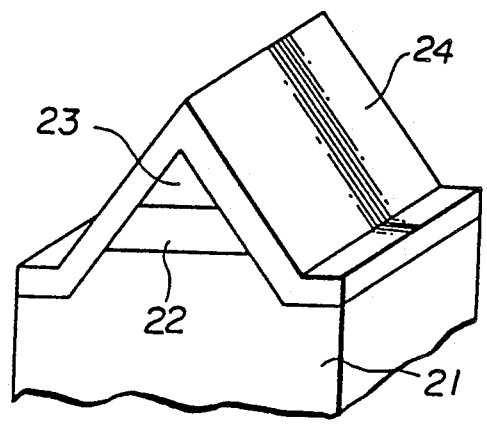
FIG. 3 is a perspective view showing still another conventional quantum effect semiconductor device having a quantum well wire.
Figure 6:
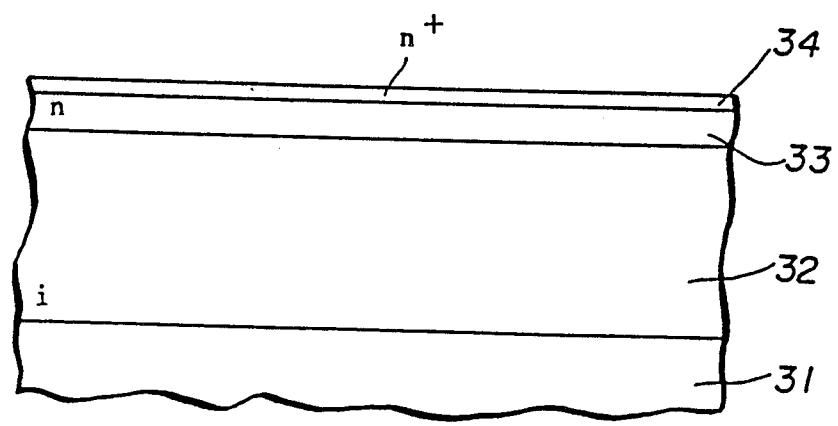
FIGS. 6 and 7 are side views in cross section respectively showing the first embodiment at essential production processes thereof.
Figure 7:
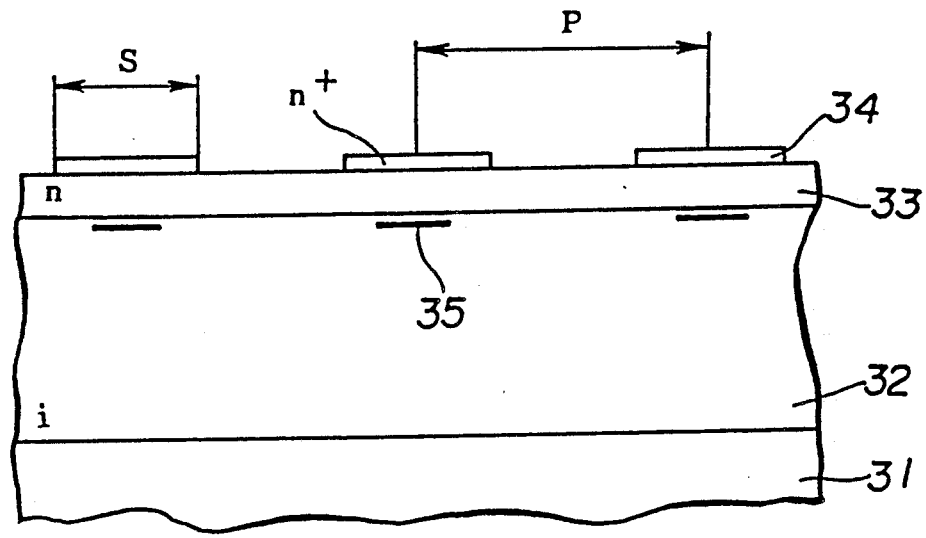

FIGS. 6 and 7 show essential parts of the first embodiment for explaining essential processes of producing the quantum effect semiconductor device. In FIGS. 6 and 7, those parts which are the same as those corresponding parts in FIGS. 4 and 5 are designated by the same reference numerals, and a description thereof will be omitted.

By use of the molecular beam epitaxy (MBE) technique, the intrinsic GaAs channel layer 32, the n-type AlGaAs electron supplying layer 33, the n+-type GaAs cap layer 34 are sequentially formed on the semiinsulative GaAs substrate 31 as shown in FIG. 6. This modulation doping structure is designed so that a depletion state is obtained by removing the cap layer 34 and an enhancement state is obtained when the cap layer 34 exists. For example, the channel layer 32 has a film thickness of 6000 Å, the electron supplying layer 33 has a film thickness of 300 Å with an impurity concentration of $1 \times 10^{18}$ cm$^{-3}$, and the cap layer 34 has a film thickness of 100 Å with an impurity concentration of $1 \times 10^{18}$ cm$^{-3}$.

A photoresist layer (not shown) is formed on the cap layer 34 shown in FIG. 6 by use of a resist process employed in the usual photolithography technique. Then, the photoresist layer is exposed and developed using a helium-cadmium (He-Cd) laser having a wavelength of 325 nm by use of the technique used to form corrugation of a distributed feedback type semiconductor laser, that is, the exposure technique using two-beam laser interference. As a result, the photoresist layer is patterned to have a width of 1000 Å with a pitch of 2000 Å. Depending on the exposure conditions of the exposure technique using the two-beam laser interference, the photoresist layer can be patterned into a width of 600 Å or less with a predetermined pitch.

The patterned photoresist layer is used as a mask, and the cap layer 34 is etched by a selective (preferential) reactive ion etching (RIE) using $CCl_2F_2+He$ as the etchant gas. Hence, the cap layer 34 is processed into quantum well wires (ultra-fine wire structure) having a width S of 1000 Å with a pitch P of 2000 Å as shown in FIG. 7. Consequently, the one-dimensional electron gas layer 35 having a width of 500 Å or less is formed at the heterointerface on the side of the channel layer 32 immediately under the cap layer 34.

When the selective RIE is used to etch the cap layer 34, the selectivity is extremely fine between GaAs and AlGaAs.

Figure 8A:
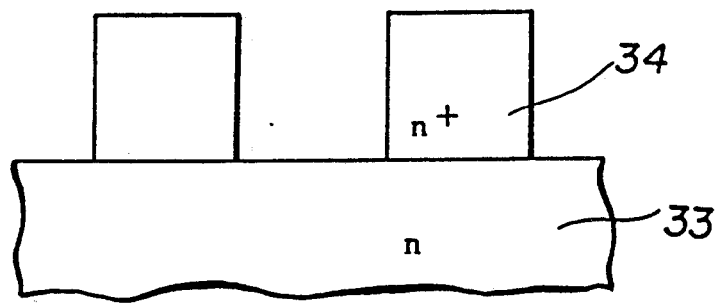
FIGS. 8A and 8B are side views in cross section respectively showing an essential part of the quantum effect semiconductor device for explaining problems of etching a cap layer.
Figure 8B:
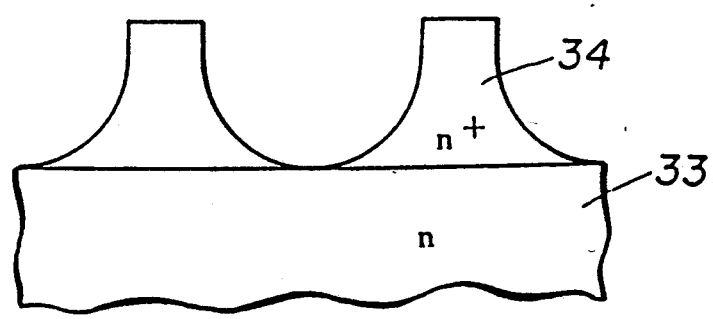

FIGS. 8A and 8B respectively show an essential part of the quantum effect semiconductor device for explaining problems of etching the cap layer 34. In FIGS. 8A and 8B, those parts which are substantially the same as those corresponding parts in FIGS. 6 and 7 are designated by the same reference numerals, and a description thereof will be omitted.

FIG. 8A shows the case where the cap layer 34 is patterned by use of the selective RIE technique. In this case, the etching with respect to GaAs is stopped to almost zero at the surface of the AlGaAs, and for this reason, the sidewalls of the etched cap layer 34 are sharply etched to the surface of the n-type AlGaAs electron supplying layer 33.

On the other hand, FIG. 8B shows the case where the cap layer 34 is patterned by use of a general etching technique other than the selective RIE. In this case, the sidewalls of the etched cap layer 34 are not sharply etched to the surface of the n-type AlGaAs electron supplying layer 33, and some GaAs remains at the bottom of the removed portion. In this case, the width of the electron gas layer becomes considerably wide, and the electron gas layer is no longer a one-dimensional electron gas layer.

In the first embodiment, the width of the cap layer 34 is set to 1000 Å by taking into account the spreading of the depletion layer. But the width of the cap layer 34 may be set to a value wider or narrower than 1000 Å according to the needs within a considerably large range.

Figure 9:
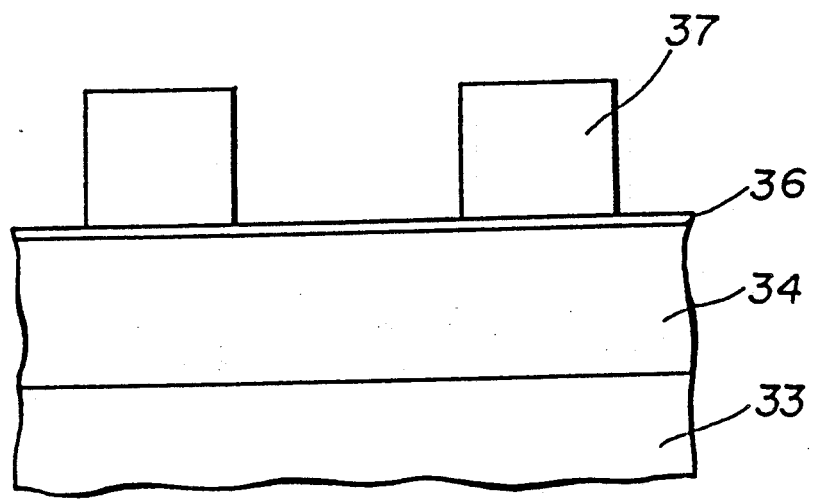
FIGS. 9 through 11 are side views in cross section respectively showing an essential part of a second embodiment of the quantum effect semiconductor device according to the present invention at essential production processes thereof for explaining the case where the width of the cap layer is made narrow.
Figure 10:
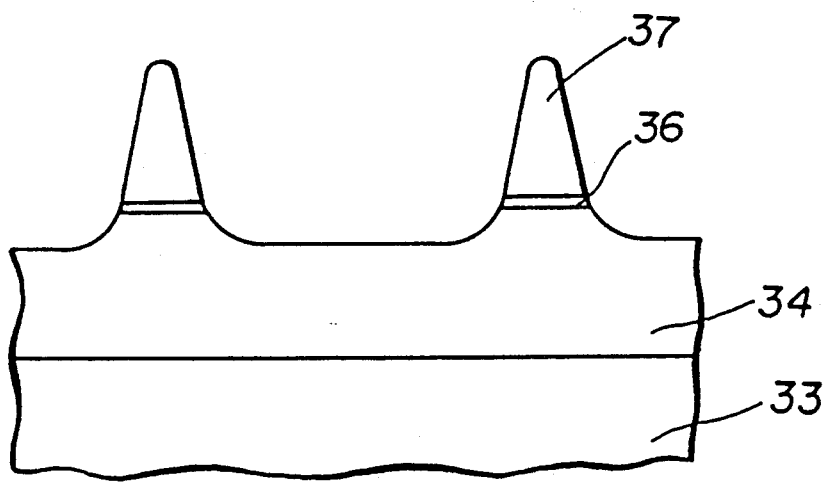
Figure 11:
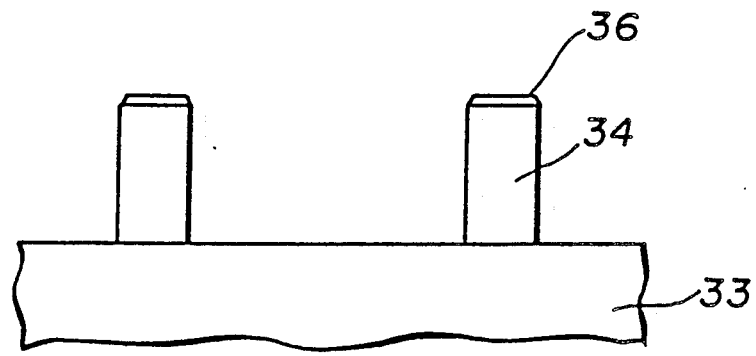

FIGS. 9 through 11 show essential parts of a second embodiment of the quantum effect semiconductor device according to the present invention at essential production processes thereof for explaining the case where the width of the cap layer is made even narrower than that of the first embodiment. In FIGS. 9 through 11, those parts which are substantially the same as those corresponding parts in FIGS. 6 through 8B are designated by the same reference numerals, and a description thereof will be omitted.

The channel layer 32 through the cap layer 34 are sequentially formed similarly as in the case of the processes described before with reference to FIGS. 6 and 7. Then, an AlGaAs etching stopper layer 36 and a GaAs mask layer 37 are formed on the cap layer 34. For example, the etching stopper layer 36 has a film thickness of 20 Å to 100 Å and desirably 60 Å, and the mask layer 37 has a film thickness of 100 Å to 1000 Å and desirably 300 Å. In addition, the mask layer 37 is etched similarly as in the case of the processes described before in conjunction with FIGS. 6 and 7. As a result, the mask layer 37 is patterned into a width S of 1000 Å with a pitch P of 2000 Å as shown in FIG. 9.

The substrate having the patterned mask layer 37 is immersed into a HF-$H_2O_2$ system etchant, and the mask layer 37, the etching stopper layer 36 and the cap layer 34 are etched as shown in FIG. 10. The widths of the mask layer 37 and the etching stopper layer 36 are made extremely narrow by this wet etching. The width of the etching stopper layer 36 is to be made extremely narrow in this case, and thus, the wet etching time must be selected depending on the desired width of the etching stopper layer 36. In the present embodiment, the wet etching is ended when the width of the etching stopper layer 36 becomes 200 Å.

Thereafter, the selective RIE using $CCl_2F_2$+He as the etchant gas is used to etch the cap layer 34. Accordingly, the cap layer 34 is etched to the same width as the etching stopper layer 36 as shown in FIG. 11, that is, a width of 200 Å. The sidewalls of the cap layer 34 are sharply etched to the surface of the electron supplying layer 33 as may be seen from FIG. 11.

In each of the embodiments described heretofore, the description is made by specifying the structure of the semiconductor layers and the width of the cap layer 34. However, the extent to which the one-dimensional electron gas is confined in the quantum well wire depends on the doping quantities and film thicknesses of the cap layer 34 and the electron supplying layer 33 and the width of the cap layer 34. Hence, the numerical values explained together with the embodiments are mere examples, and the present invention is not limited to such. The extent to which the one-dimensional electron gas is confined in the quantum well wire can thus be varied within a considerably wide range.

Next, a description will be given on a field effect transistor utilizing the one-dimensional electron gas layer 35.

Figure 12:
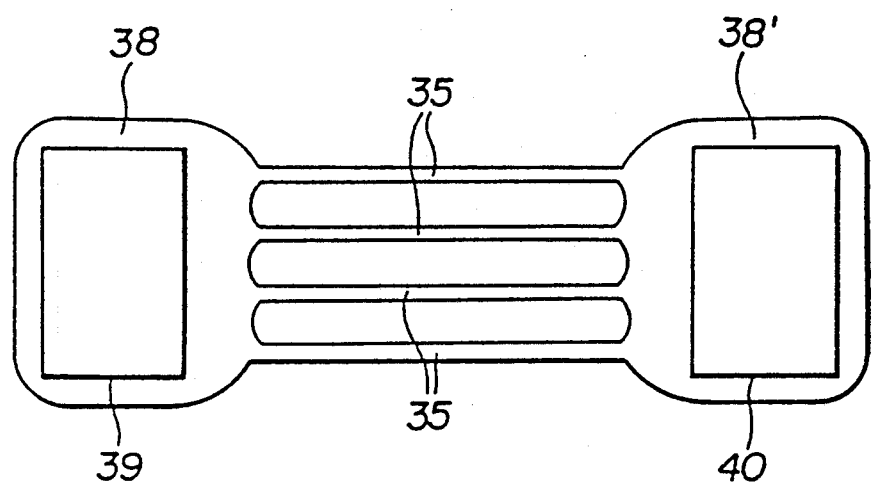
FIG. 12 is a plan view showing an essential part of an electron gas layer suited for use in the field effect transistor.

FIG. 12 shows a plan view of an essential part of the electron gas layer suited for use in the field effect transistor. In FIG. 12, those part which are substantially the same as those corresponding parts in FIGS. 6 through 11 are designated by the same reference numerals, and a description thereof will be omitted.

In FIG. 12, the field effect transistor comprises two-dimensional electron gas layers 38 and 38', a source electrode contact region 39, and a drain electrode contact region 40. As may be seen from FIG. 12, the two-dimensional electron gas layer 38 in the source region and the two-dimensional electron gas layer 38' in the drain region are coupled by four one-dimensional electron gas layers 35.

According to the field effect transistor shown in FIG. 12, the electrons run through the one-dimensional electron gas layers 35 at an extremely high velocity. The one-dimensional electron gas layers 35 connect smoothly to either the two-dimensional electron gas layer 38 or 38'. In addition, it is possible to sufficiently reduce the contact resistance at the source electrode and the drain electrode.

The gate electrode with respect to the electron gas layer shown in FIG. 12 is formed across the one-dimensional electron gas layer 35 in the form of the quantum well wires. In this case, it is possible to form a Schottky gate electrode or a metal insulator semiconductor (MIS) structure gate electrode, constitute the substrate 31 by a p-type GaAs and apply a substrate bias voltage from a back surface thereof, and make the substrate 31 semiinsulative and apply a bias voltage to a bias voltage applying layer which is made of a p-type GaAs and is interposed between the substrate 31 and the channel layer 33.

Figure 13:
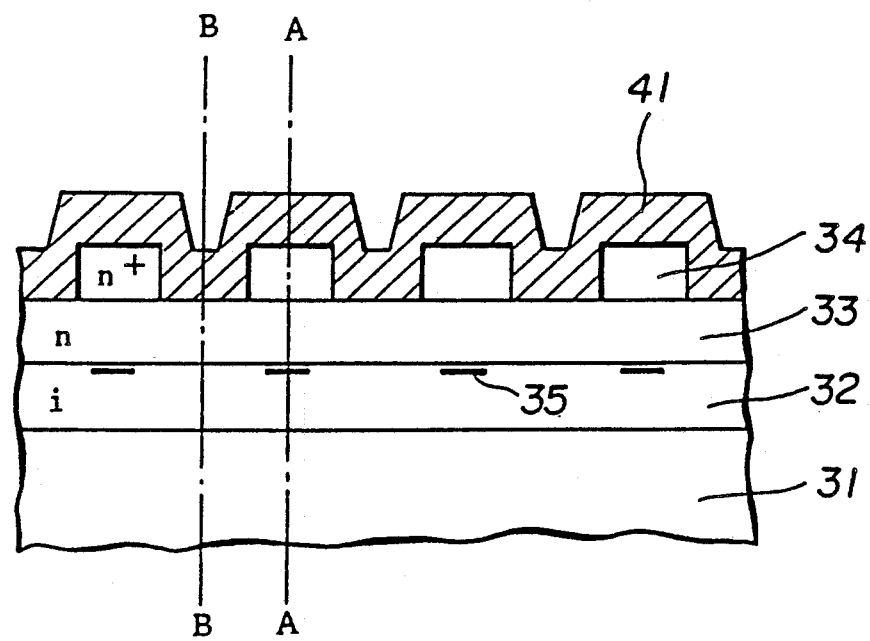
FIG. 13 is a side view in cross section showing an essential part of a third embodiment of the quantum effect semiconductor device having a Schottky gate electrode.

FIG. 13 shows an essential part of a third embodiment of the quantum effect semiconductor device having a Schottky gate electrode. In FIG. 13, those parts which are substantially the same as those corresponding parts in FIGS. 6 through 12 are designated by the same reference numerals, and a description thereof will be omitted.

The semiconductor device of the present embodiment comprises a Schottky gate electrode 41 made of aluminum (Al). When a predetermined voltage is applied to the gate electrode 41 in such a direction so as to make the one-dimensional electron gas layer 35 enter a depletion state, the semiconductor device operates as a normal field effect transistor. That is, such a normal field effect transistor operates in ON and OFF states. On the other hand, when a voltage applied to the gate electrode 41 is changed within a predetermined range, the width of the one-dimensional electron gas layers 35 changes wider or narrower.

The semiconductor device of the present embodiment can hence be operated as a field effect transistor which uses the one-dimensional electron gas, a device which modulates the one-dimensional electron gas in space and time.

Figures 14A, 14B:
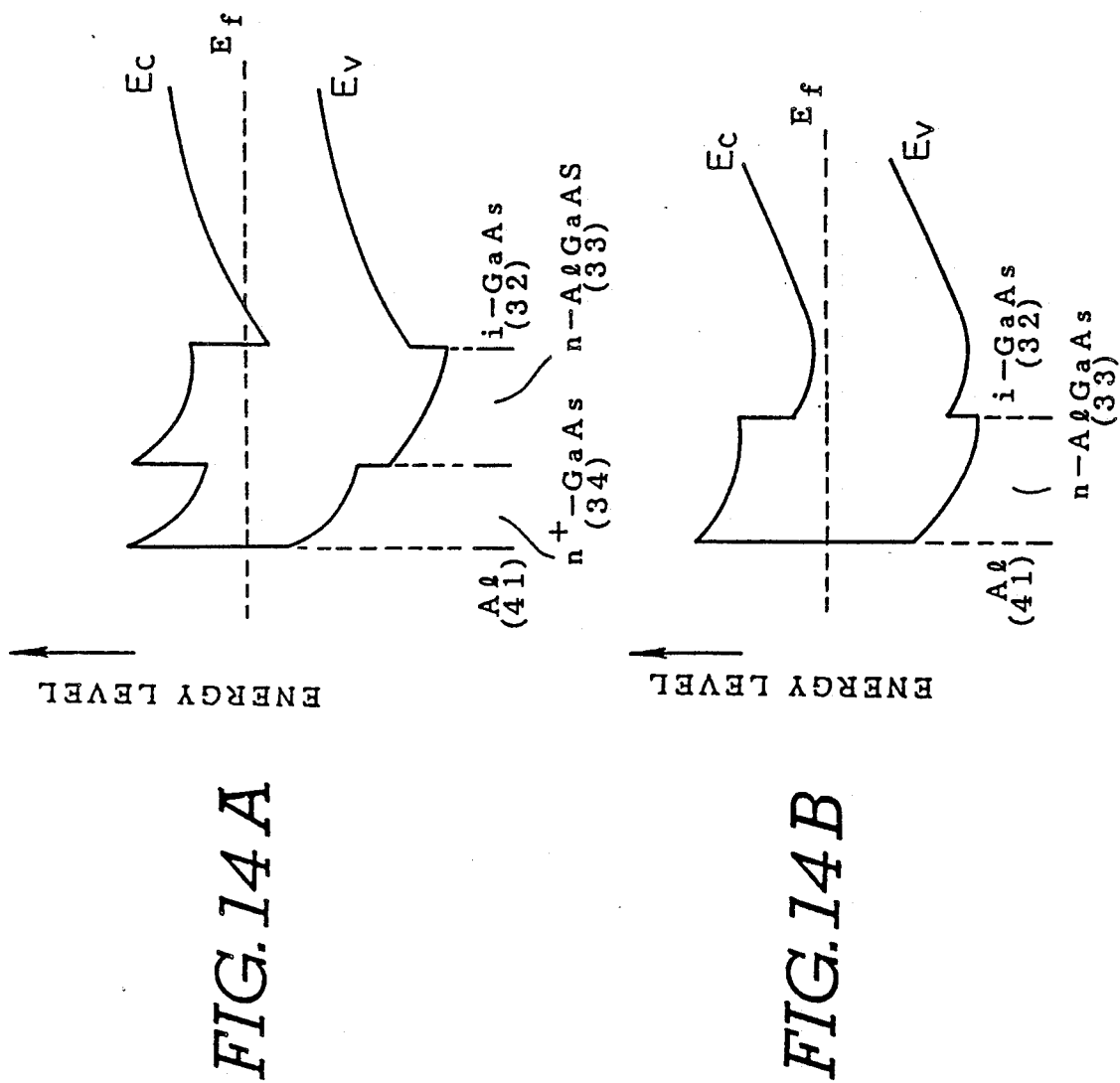
FIGS. 14A and 14B are energy band diagrams of the third embodiment along lines A—A and B—B in FIG. 13.

FIGS. 14A and 14B are energy band diagrams of the third embodiment along lines A—A and B—B in FIG. 13, respectively. In FIGS. 14A and 14B, $E_f$ denotes the Fermi level, and Ec and Ev respectively denote energy levels of the conduction and valence bands. As may be seen from FIG. 14A, the energy level of the n-type AlGaAs electron supplying layer 33 is high compared to that of the intrinsic GaAs channel layer 32, and the electrons are accumulated in the intrinsic GaAs channel layer 32 immediately under the n+-type GaAs cap layer 34. But such an accumulation of the electrons does not occur in the intrinsic GaAs channel layer 32 having no n+-type GaAs cap layer 34 immediately above, as may be seen from FIG. 14B.

Figure 15A:
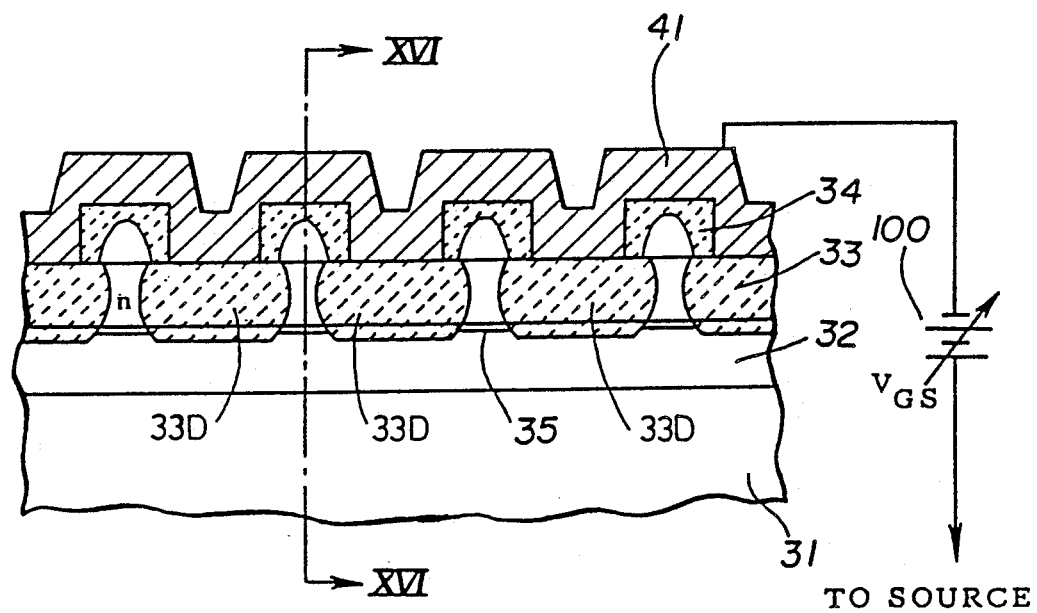
FIGS. 15A and 15B are side views in cross section respectively showing the essential part of the third embodiment together with bias means.
Figure 15B:
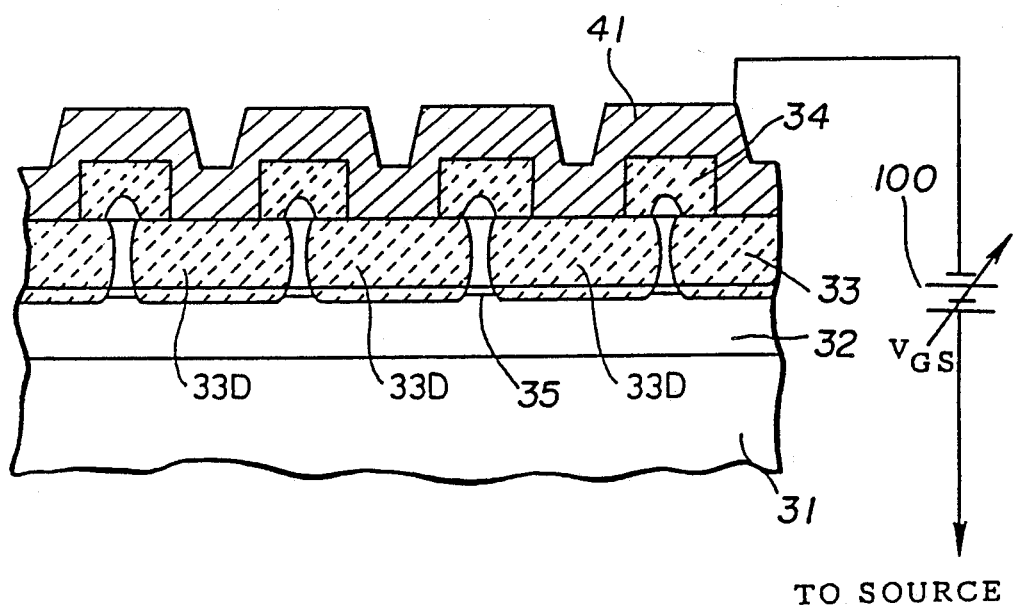

FIGS. 15A and 15B respectively show the essential part of the third embodiment with bias means 100. In FIGS. 15A and 15B, those parts which are the same as those corresponding parts in FIG. 13 are designated by the same reference numerals, and a description thereof will be omitted. FIG. 15A shows the case where a voltage $V_{GS}$ applied across the gate and a source (not shown), that is, the gate electrode 41 and a source electrode (not shown), is $V_1$, for example $-0.5$V. FIG. 15B shows the case where $V_{GS}=V_2$, for example $-1.0$V. $V_1$ and $V_2$ are negative voltages such that $V_2$ is deeper than $V_1$. It can be seen from FIGS. 15A and 15B that the width of the one-dimensional electron gas layer 35 can be variably controlled depending on the voltage $V_{GS}$. That is, the depletion regions 33D in FIG. 15B are wider and deeper than that in FIG. 15A. The width the one-dimensional electron gas layer 35 is a maximum when the $V_{GS}=0$, and the one-dimensional electron gas layer 35 disappears when $V_{GS}$ is a large voltage, for example $V_{GS}=-2$V. In FIGS. 15A and 15B, the depletion layers (regions) are indicated by phantom hatchings.

Figure 16:
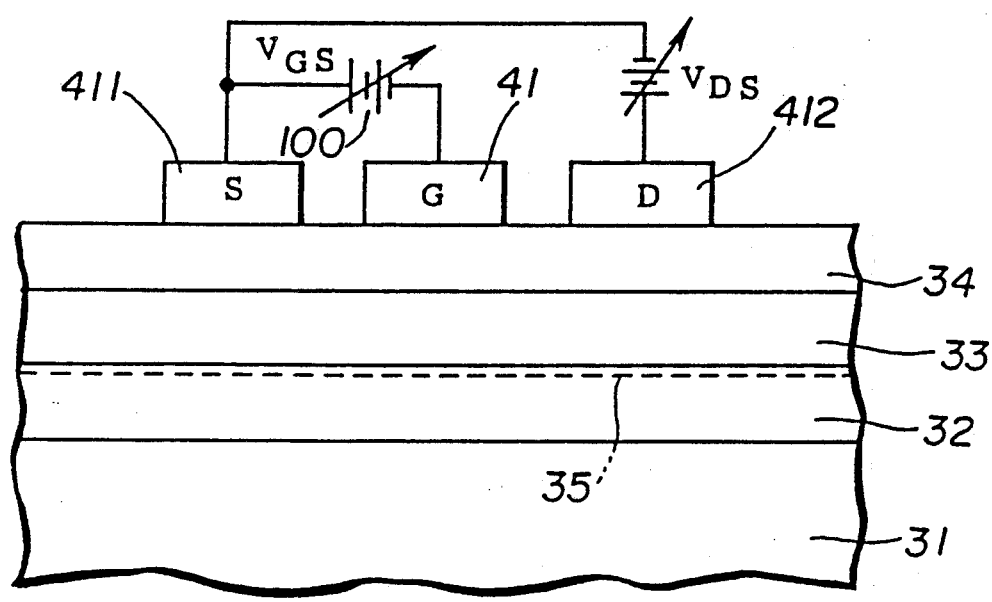
FIG. 16 is a cross sectional view of the third embodiment along a line XVI—XVI in FIG. 15A.

FIG. 16 shows the third embodiment along a line XVI—XVI in FIG. 15A. As shown, the voltage $V_{GS}$ is applied across the gate electrode 41 and a source electrode 411, and a voltage $V_{DS}$ is applied across a drain electrode 422 and the source electrode 411.

For example, a value K which is one of the performance indexes of the field effect transistor is described by the following equation (b 1) in the current saturation region by gradual channel approximation, where $\mu$ denotes the electron mobility, $C_A$ denotes the electrostatic capacitance of the AlGaAs layer ($C_A=\epsilon/d$ where $\epsilon$ denotes the dielectric constant of AlGaAs and d denotes the film thickness of the AlGaAs layer), $W_G$ denotes the gate width and $L_G$ denotes the gate length.

$$K=\mu C_A W_G/(2L_G) \quad (1)$$

In the present invention, both $\mu$ and $W_G$ are functions of the gate voltage, and the equation describing the value K does not become as simple as equation (1). However, equation (1) stands as a first approximation.

According to equation (1), even when the effective gate width $W_G$ becomes narrow due to the applied voltage, it is possible to obtain an increase in the value K as long as there is a large rate of increase in the mobility due to the notable quantum effect obtained by the narrowing gate width.

The rate of increase in the mobility even reaches $10^6$ cm²/Vs to $10^7$ cm²/Vs which is greater than that of the conventional device using the two-dimensional electron gas at the GaAs/AlGaAs heterointerface by one or two figures. This means that the value K can be increased. In addition, it is thought that these effects are even more notable with respect to semiconductors such as InGaAs/InAlAs system semiconductors having alloy scattering.

Figure 17:
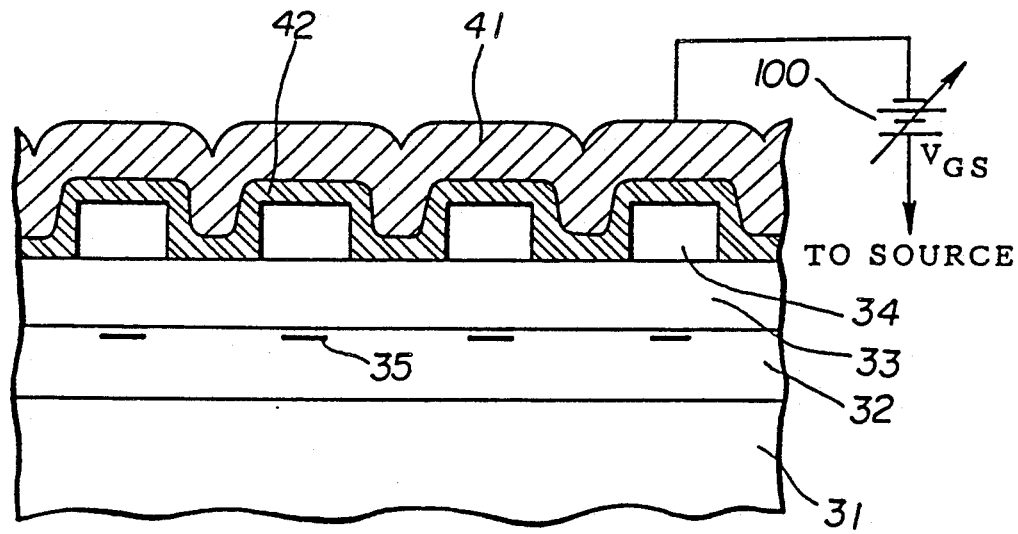
FIG. 17 is a side view in cross section showing an essential part of a fourth embodiment of the quantum effect semiconductor device having a MIS structure gate electrode.

FIG. 17 shows an essential part of a fourth embodiment of the quantum effect semiconductor device having a MIS structure gate electrode. In FIG. 17, those parts which are substantially the same as those corresponding parts in FIGS. 6 through 13 are designated by the same reference numerals, and a description thereof will be omitted.

The present embodiment of the semiconductor device comprises a gate insulator layer 42 made of silicon dioxide ($SiO_2$) and having a film thickness in the order of 500 Å, for example. The voltage $V_{GS}$ is applied across the gate electrode 41 and a source electrode (not shown). The operation of the present embodiment is essentially the same as that of the third embodiment shown in FIG. 13.

In FIG. 17 and FIGS. 18 through 21 which will be described hereunder, the illustration of the source electrode and the drain electrode will be omitted since the positional relationship to the gate electrode can readily be understood from FIG. 16 described before.

Figure 18:
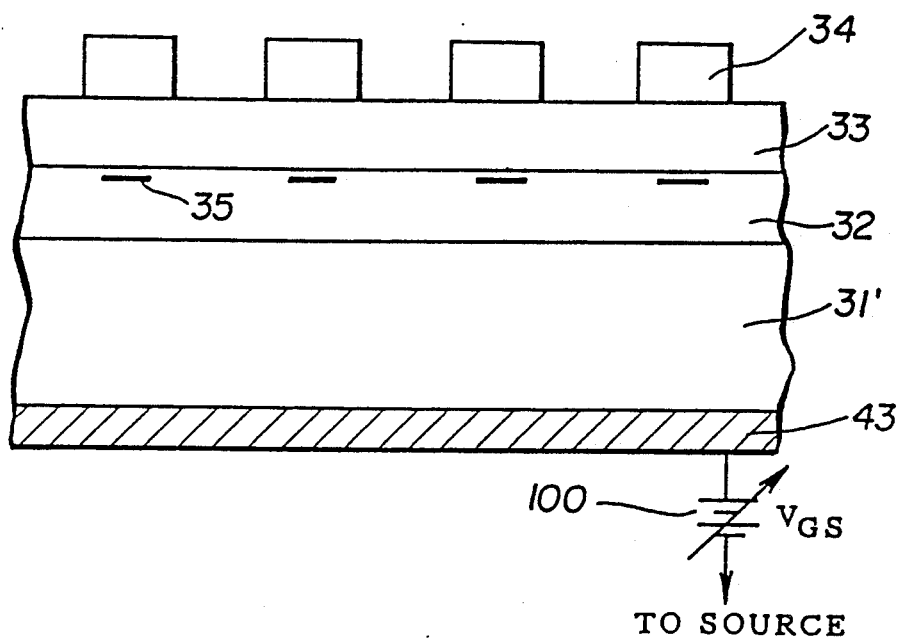
FIG. 18 is a side view in cross section showing an essential part of a fifth embodiment of the quantum effect semiconductor device having a modified gate electrode.

FIG. 18 shows an essential part of a fifth embodiment of the quantum effect semiconductor device having a modified gate electrode. In FIG. 18, those parts which are substantially the same as those corresponding parts in FIGS. 6 through 13 and 17 are designated by the same reference numerals, and a description thereof will be omitted.

The present embodiment of the semiconductor device comprises a p-type GaAs substrate 31' and an electrode 43 made of AuZn/Au (two-layer construction). For convenience's sake, the film thickness of the substrate 31' is shown on a reduced scale compared to the film thicknesses of other layers. As may be seen from FIG. 18, the substrate 31' is made of p-type GaAs and is conductive, and the voltage $V_{GS}$ is applied to the electrode 43 formed on a back surface, thereby obtaining the an effect similar to the case where the so-called back gate bias voltage is applied. In other words, the voltage $V_{GS}$ is applied across the electrode 43 and a source electrode (not shown), and the voltage $V_{GS}$ is a positive voltage in this case because the substrate 31' is the p-type GaAs.

Figure 19:
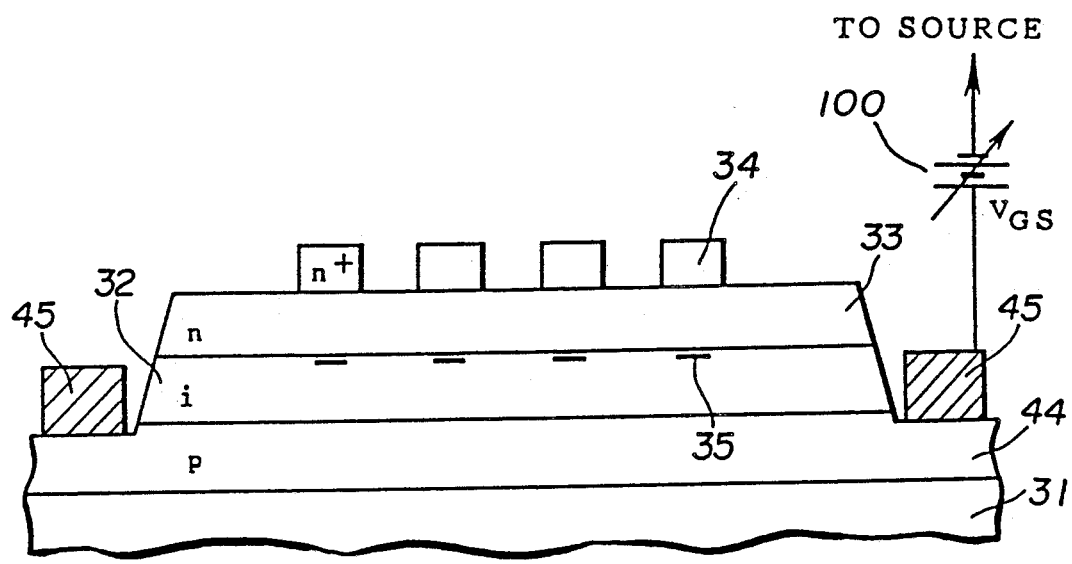
FIG. 19 is a side view in cross section showing an essential part of a sixth embodiment of the quantum effect semiconductor device also having a modified gate electrode.

FIG. 19 shows an essential part of a sixth embodiment of the quantum effect semiconductor device also having a modified gate electrode. In FIG. 19, those parts which are substantially the same as those corresponding parts in FIGS. 6 through 13, 17 and 18 are designated by the same reference numerals, and a description thereof will be omitted.

The present embodiment of the semiconductor device comprises a p-type GaAs bias voltage applying layer 44 and an electrode 45 made of AuZn/Au (two-layer construction). As may be seen from FIG. 19, the substrate 31 is made of semiinsulative GaAs and the bias voltage applying layer 44 made of p-type GaAs is formed on the substrate 31. The voltage $V_{GS}$ is applied across the electrode 45 and a source electrode (not shown). Accordingly, it is possible to make the present embodiment operate similarly as in the case of the fifth embodiment shown in FIG. 18 by applying a voltage to the bias voltage applying layer 44 through the electrode 45.

Figure 20:
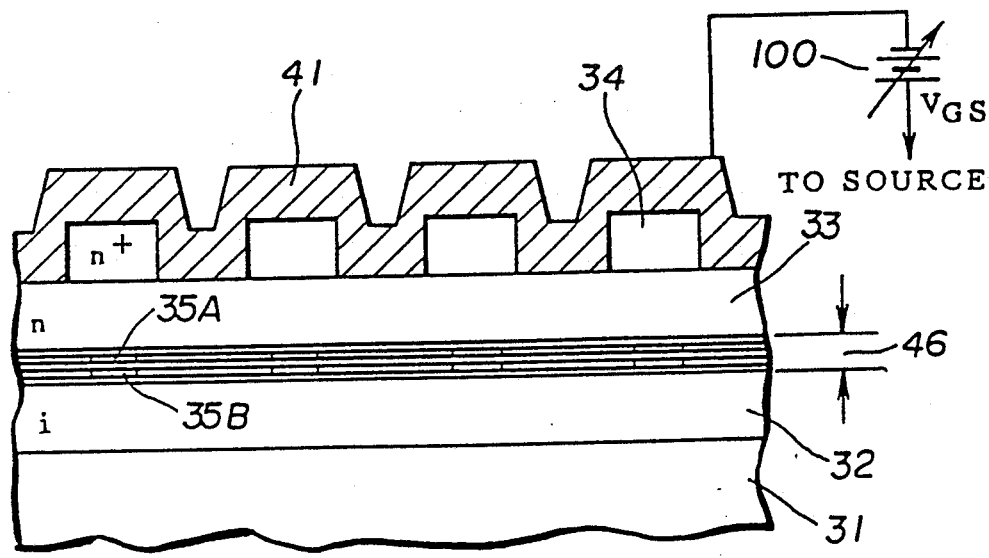
FIG. 20 is a side view in cross section showing an essential part of a seventh embodiment of the quantum effect semiconductor device using a multiquantum well.
Figure 21:
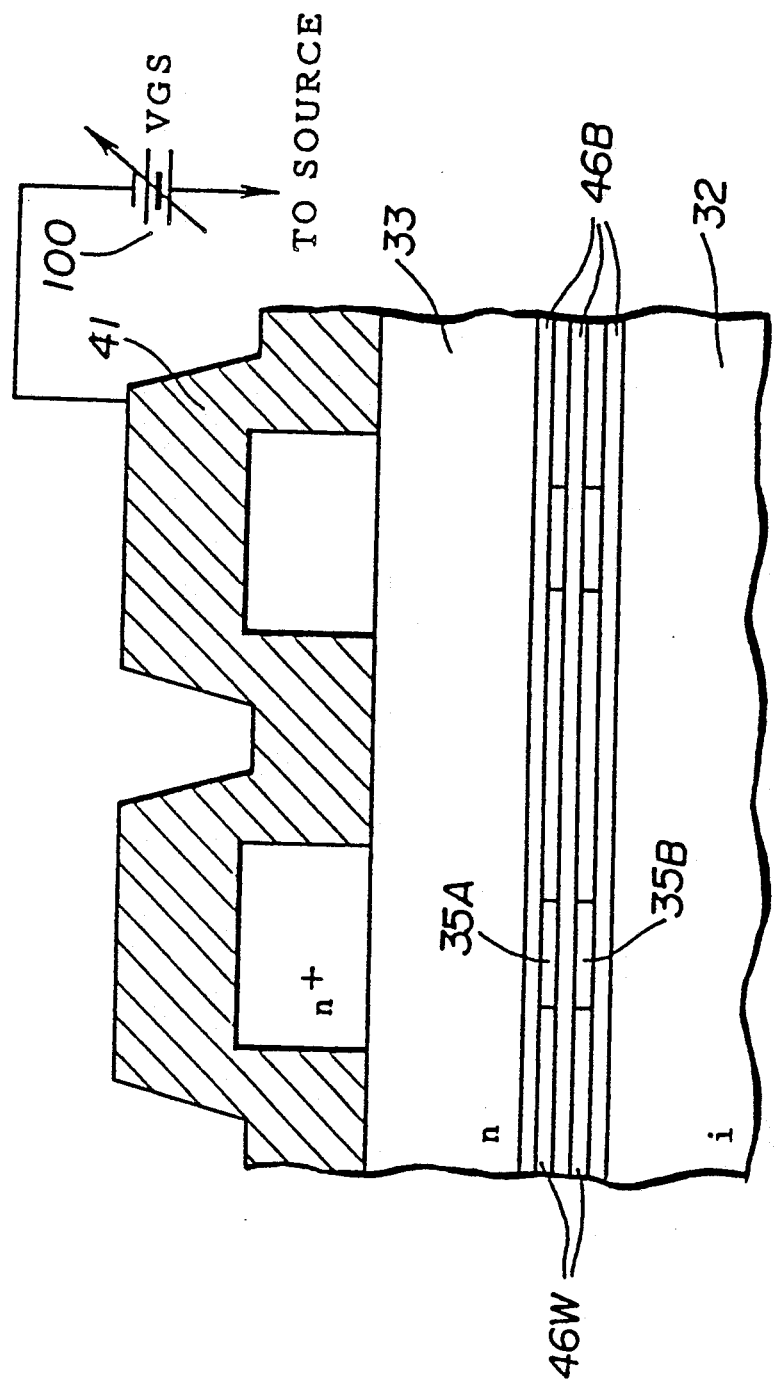
FIG. 21 is a side view in cross section showing an essential part of the seventh embodiment on an enlarged scale.

FIG. 20 shows an essential part of a seventh embodiment of the quantum effect semiconductor device using a multiquantum well, and FIG. 21 shows an essential part of the seventh embodiment on an enlarged scale. In FIGS. 20 and 21, those parts which are substantially the same as those corresponding parts in FIGS. 6 through 13 and FIGS. 17 through 19 are designated by the same reference numerals, and a description thereof will be omitted.

The present embodiment of the semiconductor device comprises a multiquantum well 46, a barrier layer 46B, a well layer 46W, and one-dimensional electron gas layers 35A and 35B formed in the well layer 46W. As may be seen from FIGS. 20 and 21, the multiquantum well 46 is interposed between the channel layer 32 and the electron supplying layer 33. According to this structure, the one-dimensional electron gas layer 35A or 35B is formed for every well layer 46W, and thus, it is possible to form vertically arranged quantum well wires. The voltage $V_{GS}$ is applied across the gate electrode 41 and a source electrode (not shown).

The mean free path of electrons in the one-dimensional electron gas layer is long compared to that in the bulk or two-dimensional electron gas layer. Hence, the present embodiment can be used as a quantum effect semiconductor device using the wave characteristics of electrons. In FIGS. 20 and 21, an interference occurs between the vertically arranged one-dimensional electron gas layers 35A and 35B, and a phase shift occurs between the wave function of the one-dimensional electron gas layer 35A and the wave function of the one-dimensional electron gas layer 35B. As a result, it is possible to vary the output of the semiconductor device.

In the embodiments described heretofore, the electron gas layers are one-dimensional electron gas layers. But is possible to make the electron gas layers zero-dimensional with ease by carrying out the exposure process with respect to the photoresist in both the X and Y directions when patterning the cap layer into the quantum well wires (ultrafine wire structure). In this case, the so-called quantum well is formed. In addition, GaAs/AlGaAs system semiconductors are used as the semiconductor materials, but it is evident that any material can be used as long as the two-dimensional carrier gas is formed by the modulation doping. Examples of such other semiconductor materials are InP/InGaAsP system semiconductors. Furthermore, the RIE technique using $CCl_2F_2$ as the etchant gas is employed when carrying out the selective etching, however, any appropriate technique may be used to suit the semiconductor materials used. For example, when the InP/InGaAsP system semiconductors are used as the semiconductor materials, it is possible to employ a wet etching technique.

Moreover, the developing technique is not limited to the technique used to form corrugation of a distributed feedback type semiconductor laser, that is, the exposure technique using two-beam laser interference. For example, the electron beam developing technique may be employed to obtain a pattern having a width of 0.1 $\mu$m. By employing the FIB developing technique, it is possible to obtain a pattern having a width of 0.1 $\mu$m at the present and even in the order of 100 Å when used to the limit. It is also possible to obtain a pattern having a width of 100 Å by employing the developing technique using the X-ray developing technique. Of course, the light source used for the developing process is not limited to the He-Cd laser used in the described embodiment.

In addition, the channel layer and thus the one-dimensional electron gas layers are arranged periodically in the described embodiments, but it is not essential that the channel layer and the one-dimensional electron gas layers are arranged periodically.

Further, the present invention is not limited to these embodiments, but various variations and modifications may be made without departing from the scope of the present invention.

What is claimed is:

1. A quantum effect semiconductor device comprising:
    a substrate;
    a channel layer formed on said substrate and being a substantially non-doped semiconductor;
    a doped carrier supplying layer formed on said channel layer and having a smaller electron affinity than said channel layer;
    a doped cap layer formed on said doped carrier supplying layer in a form of an ultra-fine wire;
    a gate electrode formed on said doped cap layer;
    a source electrode and a drain electrode formed at both sides of said gate electrode;
    a depletion region formed in said doped carrier supplying layer and extending to an interface between said channel layer and said doped carrier supplying layer, said depletion region not formed in a portion immediately under said doped cap layer; and
    bias means for applying a voltage across said gate electrode and said source electrode, said voltage controlling a spreading of said depletion region therein controlling a width of a one-dimensional electron gas layer at a heterointerface on a side of said channel layer immediately under said doped cap layer.

2. A quantum effect semiconductor device as claimed in claim 1 in which said doped cap layer in the form of the ultra-fine wire is formed intermittently on said doped carrier supplying layer, said depletion region being formed in said doped carrier supplying layer and extending to the interface between said channel layer and said doped carrier supplying layer except for the portion immediately under said doped cap layer from both sides of the portion.

3. A quantum effect semiconductor device as claimed in claim 2 in which said doped cap layer in the form of the ultra-fine wire is formed periodically on said doped carrier supplying layer.

4. A quantum effect semiconductor device as claimed in claim 1 in which said gate electrode has a metal insulator semiconductor structure made up of a gate insulator layer formed on said doped cap layer and a gate metal layer formed on said gate insulator layer.

5. A quantum effect semiconductor device as claimed in claim 1 in which said doped carrier supplying layer is a doped electron supplying layer.

6. A quantum effect semiconductor device comprising:

a substrate;

a channel layer formed on said substrate and being a substantially non-doped semiconductor;

a doped carrier supplying layer formed on said channel layer and having a smaller electron affinity than said channel layer;

a doped cap layer formed on said doped carrier supplying layer in a form of an ultra-fine wire;

a gate electrode formed on said substrate;

a source electrode and a drain electrode each formed on said doped carrier supplying layer;

a depletion region formed in said doped carrier supplying layer and extending to an interface between said channel layer and said doped carrier supplying layer, said depletion region not formed in a portion immediately under said doped cap layer; and bias means for applying a voltage across said gate electrode and said source electrode, said voltage controlling a spreading of said depletion region therein controlling a width of a one-dimensional electron gas layer at a heterointerface on a side of said channel layer immediately under said doped cap layer.

7. A quantum effect semiconductor device as claimed in claim 6 in which said doped cap layer in the form of the ultra-fine wire is formed intermittently on said doped carrier supplying layer, said depletion region being formed in said doped carrier supplying layer and extending to the interface between said channel layer and said doped carrier supplying layer except for the portion immediately under said doped cap layer from both sides of the portion.

8. A quantum effect semiconductor device as claimed in claim 7 in which said doped cap layer in the form of the ultra-fine wire is formed periodically on said doped carrier supplying layer.

9. A quantum effect semiconductor device as claimed in claim 6 in which said doped carrier supplying layer is a doped electron supplying layer.

10. A quantum effect semiconductor device comprising:

a substrate;

a doped bias voltage applying layer formed on said substrate;

a channel layer formed on said doped bias voltage applying layer and being a substantially non-doped semiconductor;

a doped carrier supplying layer formed on said channel layer and having a smaller electron affinity than said channel layer;

a doped cap layer formed on said doped carrier supplying layer in a form of an ultra-fine wire;

a gate electrode formed on said bias voltage applying layer;

a source electrode and a drain electrode each formed on said doped carrier supplying layer;

a depletion region formed in said doped carrier supplying layer and extending to an interface between said channel layer and said doped carrier supplying layer, said depletion region not formed in a portion immediately under said doped cap layer; and bias means for applying a voltage across said gate electrode and said source electrode, said voltage controlling a spreading of said depletion region therein controlling a width of a one-dimensional electron gas layer at a heterointerface on a side of said channel layer immediately under said doped cap layer.

11. A quantum effect semiconductor device as claimed in claim 10 in which said doped cap layer in the form of the ultra-fine wire is formed intermittently on said doped carrier supplying layer, said depletion region being formed in said doped carrier supplying layer and extending to the interface between said channel layer and said doped carrier supplying layer except for the portion immediately under said doped cap layer from both sides of the portion.

12. A quantum effect semiconductor device as claimed in claim 11 in which said doped cap layer in the form of the ultra-fine wire is formed periodically on said doped carrier supplying layer.

13. A quantum effect semiconductor device as claimed in claim 10 in which said doped carrier supplying layer is a doped electron supplying layer.

14. A quantum effect semiconductor device comprising:

a substrate;

a channel layer formed on said substrate and being a substantially non-doped semiconductor;

a multiquantum well formed on said channel layer;

a doped carrier supplying layer formed on said multiquantum well and having a smaller electron affinity than said channel layer;

a doped cap layer formed on said doped carrier supplying layer in a form of an ultra-fine wire;

a gate electrode, a source electrode and a drain electrode each formed on said doped carrier supplying layer;

a depletion region formed in said doped carrier supplying layer and extending to an interface between said channel layer and said doped carrier supplying layer, said depletion region not formed in a portion immediately under said doped cap layer; and bias means for applying a voltage across said gate electrode and said channel layer, said voltage controlling a spreading of said depletion region therein controlling a width of a one-dimensional electron gas layer at a heterointerface on a side of said channel layer immediately under said doped cap layer.

15. A quantum effect semiconductor device as claimed in claim 14 in which said doped cap layer in the form of the ultra-fine wire is formed intermittently on said doped carrier supplying layer, said depletion region being formed in said doped carrier supplying layer and extending to the interface between said channel layer and said doped carrier supplying layer except for the portion immediately under said doped cap layer from both sides of the portion.

16. A quantum effect semiconductor device as claimed in claim 15 in which said doped cap layer in the form of the ultra-fine wire is formed periodically on said doped carrier supplying layer.

17. A quantum effect semiconductor device as claimed in claim 14 in which said doped carrier supplying layer is a doped electron supplying layer.

18. A quantum effect semiconductor device as claimed in claim 14 in which said multiquantum well comprises alternately stacked barrier layers and well layers, said one-dimensional electron gas layer being formed in said well layer between two mutually adjacent barrier layers.

* * * * *